(12) United States Patent
Zhang et al.

(10) Patent No.: US 10,729,005 B2
(45) Date of Patent: Jul. 28, 2020

(54) ARRAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zhengxin Zhang, Beijing (CN); Shuai Xu, Beijing (CN); Zhiyong Wang, Beijing (CN); Haifei Su, Beijing (CN)

(73) Assignees: BEIJING BOE OTPOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/326,304

(22) PCT Filed: May 14, 2018

(86) PCT No.: PCT/CN2018/086662
§ 371 (c)(1),
(2) Date: Feb. 18, 2019

(87) PCT Pub. No.: WO2018/219128
PCT Pub. Date: Dec. 6, 2018

(65) Prior Publication Data
US 2019/0191548 A1    Jun. 20, 2019

(30) Foreign Application Priority Data
Jun. 1, 2017 (CN) .......................... 2017 1 0403928

(51) Int. Cl.
*H05K 1/00* (2006.01)
*H05K 1/02* (2006.01)
(Continued)

(52) U.S. Cl.
CPC ....... *H05K 1/0259* (2013.01); *G02F 1/13452* (2013.01); *G02F 1/13458* (2013.01);
(Continued)

(58) Field of Classification Search
USPC .......................................................... 361/749
See application file for complete search history.

(56) References Cited

U.S. PATENT DOCUMENTS

| | | | | |
|---|---|---|---|---|
| 2002/0057393 A1* | 5/2002 | Park | .................... | G02F 1/13458 349/43 |
| 2002/0132385 A1* | 9/2002 | Dojo | .................. | H01L 27/1214 438/30 |
| 2015/0331270 A1* | 11/2015 | Yokogawa | .......... | G02F 1/13306 349/42 |

FOREIGN PATENT DOCUMENTS

| | | |
|---|---|---|
| CN | 101201482 A | 6/2008 |
| CN | 103925517 A | 7/2014 |

(Continued)

OTHER PUBLICATIONS

First Office Action dated May 21, 2019 corresponding to Chinese application No. 201710403928.8.
(Continued)

*Primary Examiner* — Andargie M Aychillhum
(74) *Attorney, Agent, or Firm* — Nath, Goldberg & Meyer; Joshua B. Goldberg; Stephanie F. Majkut

(57) ABSTRACT

The present disclosure provides an array substrate and a display device and belongs to the field of display technology. The array substrate of the present disclosure includes a driving chip and a signal connection line, wherein a first end of the signal connection line is disposed over a first pad corresponding to a peripheral circuit board and has a first through hole at a position corresponding to the first pad; a second end of the signal connection line is disposed over a second pad corresponding to the driving chip and has a
(Continued)

second through hole at a position corresponding to the second pad; the array substrate further includes a static electricity discharge structure connected to the second end of the signal connection line.

10 Claims, 1 Drawing Sheet

(51) Int. Cl.
*H05K 1/18* (2006.01)
*H05K 1/11* (2006.01)
*G02F 1/1345* (2006.01)
*G02F 1/1362* (2006.01)
*H01L 27/32* (2006.01)

(52) U.S. Cl.
CPC .... *G02F 1/136204* (2013.01); *H01L 27/3276* (2013.01); *H01L 27/3288* (2013.01); *H05K 1/111* (2013.01); *H05K 1/181* (2013.01); *H05K 1/028* (2013.01); *H05K 2201/09272* (2013.01)

(56) References Cited

FOREIGN PATENT DOCUMENTS

| CN | 204481026 U | 7/2015 |
| CN | 105655326 A | 6/2016 |
| CN | 106094370 A | 11/2016 |
| CN | 106773414 A | 5/2017 |
| CN | 106970496 A | 7/2017 |

OTHER PUBLICATIONS

International Search Report dated Jul. 28, 2018 corresponding to application No. PCT/CN2018/086662.

\* cited by examiner

ARRAY SUBSTRATE AND DISPLAY DEVICE

CROSS-REFERENCE TO RELATED APPLICATION

This is a National Phase Application filed under 35 U.S.C. 371 as a national stage of PCT/CN2018/086662, filed on May 14, 2018, an application claiming the benefit of priority to Chinese Patent Application No. 201710403928.8 filed on Jun. 1, 2017, the contents of which are incorporated herein in their entirety by reference.

TECHNICAL FIELD

The present disclosure relates to the field of display technology, and in particular, relates to an array substrate and a display device.

BACKGROUND

An array substrate of a display device generally includes a signal connection line for connecting various circuit structures. If ESD (electrostatic discharge) occurs in the signal connection line, a defect may be caused in the array substrate.

SUMMARY

The present disclosure provides an array substrate and a display device.

In an aspect, the array substrate according to the present disclosure includes a first structure, a second structure, a signal connection line and a static electricity discharge structure, wherein the signal connection line comprises a first end connected to the first structure and a second end connected to the second structure, and the static electricity discharge structure is connected to the second end of the signal connection line but not connected to the second structure, and is configured to lead out static electricity, the first end has a first through hole, and the second end has a second through hole; the first end is connected, through a first pad, to the first structure at the first through hole, and the second end is connected, through a second pad, to the second structure at the second through hole.

According to an embodiment of the present disclosure, an end of the static electricity discharge structure distal to the signal connection line is thinner than the first end of the signal connection line.

According to an embodiment of the present disclosure, the end of the static electricity discharge structure distal to the signal connection line is thinner than the second end of the signal connection line.

According to an embodiment of the present disclosure, the static electricity discharge structure and the signal connection line are formed as an integral structure.

According to an embodiment of the present disclosure, the second end is thinner than the first end.

According to an embodiment of the present disclosure.

According to an embodiment of the present disclosure, the static electricity discharge structure is provided with a plurality of third through holes.

According to an embodiment of the present disclosure, the static electricity discharge structure and the signal connection line are made of ITO.

According to an embodiment of the present disclosure, the first structure is a peripheral circuit board, and the second structure is a driving chip.

According to an embodiment of the present disclosure, the peripheral circuit board is a flexible circuit board.

According to an embodiment of the present disclosure, the static electricity discharge structure has a shape of a sharp corner.

According to an embodiment of the present disclosure, the driving chip is one of a source driving chip and a gate driving chip.

In another aspect, the display device according to the present disclosure includes the above array substrate.

DETAILED DESCRIPTION

To enable those skilled in the art to better understand technical solutions of the present application, the present disclosure will be further described in detail below with reference to the accompanying drawings and specific embodiments.

Figure 1:
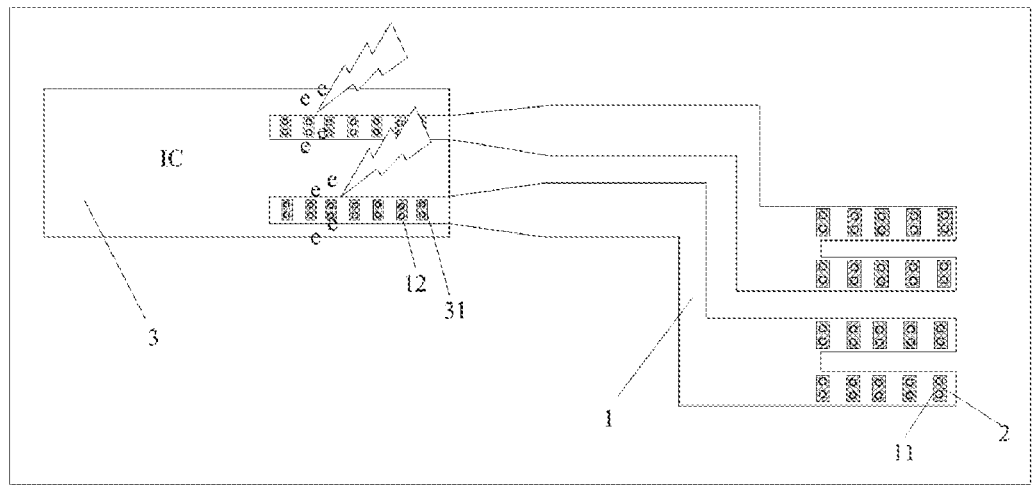
FIG. 1 is a schematic diagram illustrating a peripheral area of an existing array substrate.

FIG. 1 illustrates a structure of a peripheral area of an array substrate. A driving chip, a signal connection line, and a first pad configured be bonded with a flexible circuit board are provided in the peripheral area. The driving chip has a plurality of second pads. A first end of the signal connection line covers an area where the first pad is located, and has a first through hole at a position corresponding to the first pad, and a second end of the signal connection line covers an area where the second pads are located and has second through holes at positions corresponding to the second pads.

Since the second pad on the driving chip has a relatively small area, in order to lower impedance, the second end of the signal connection line is generally designed to be thinner than the first end, so ESD (electrostatic discharge) is prone to occur at the second end of the signal connection line, which causes the second end of the signal connection line to be burned, resulting in a defect in the array substrate.

Figure 2:
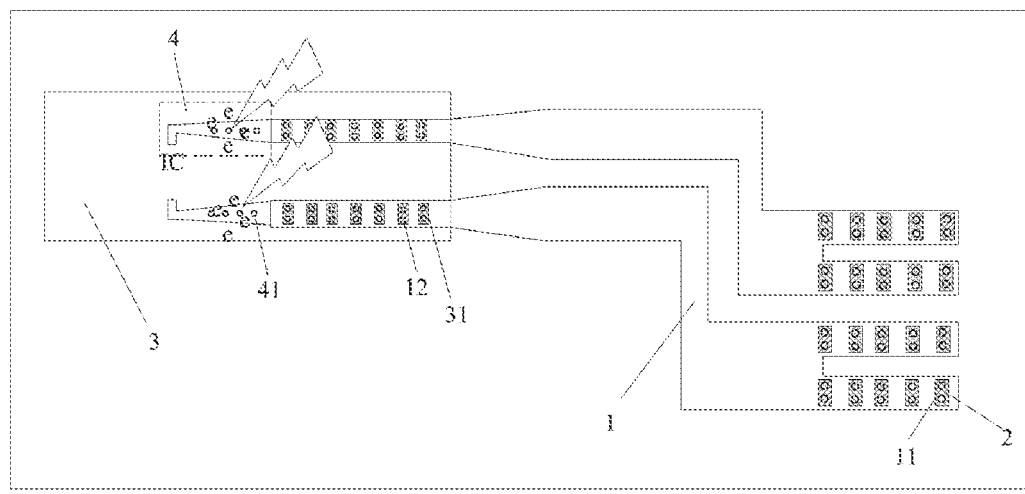
FIG. 2 is a schematic diagram illustrating a peripheral area of an array substrate according to an embodiment of the present disclosure.

As shown in FIG. 2, the embodiment provides an array substrate. A driving chip 3 and a signal connection line 1 are disposed in a peripheral area of the array substrate. A first end of the signal connection line 1 is disposed over a first pad 2 corresponding to a peripheral circuit board and has a first through hole 11 at a position corresponding to the first pad 2. A second end of the signal connection line 1 is disposed over a second pad 31 corresponding to the driving chip 3 and has a second through hole 12 at a position corresponding to the second pad 31. In particular, the array substrate in the embodiment is further provided thereon with a static electricity discharge structure 4, and the static electricity discharge structure 4 is connected to the second end of the signal connection line 1.

Because the second end of the signal connection line 1 in some embodiments is thinner than the first end thereof, that is, the end of the signal connection line 1 connected to the driving chip 3 is thinner than the end of the signal connection line 1 connected to the first pad 2, most of the electric charges generated in the manufacturing process of the array substrate accumulate on the second end of the signal connection line 1, and as a result, ESD (electrostatic discharge) is prone to occur at the second end of the signal connection line 1, thereby causing the second end of the signal connection line 1 to be burned out. The array substrate of the embodiment is additionally provided with a static electricity discharge structure 4 connected to the second end of the signal connection line 1, the second end of the signal connection line 1 is connected to the driving chip through the second pad, but the static electricity discharge structure 4 is not connected to the driving chip. Therefore, the charges generated in the manufacturing process of the array substrate can be transferred to the static electricity discharge structure 4, thereby avoiding the problem that ESD occurs at the second end of the signal connection line 1 to burn out the signal connection line 1 to cause a defect in the array substrate.

The static electricity discharge structure 4 and the signal connection line 1 in the present embodiment are formed to be an integral structure, and one end of the static electricity discharge structure 4 distal to the signal connection line 1 is thinner than the first end of the signal connection line 1.

As such, the signal connection line 1 and the static electricity discharge structure 4 may be formed in one patterning process, thereby reducing the cost and increasing the productivity. In some embodiments, the signal connection line 1 and the static electricity discharge structure 4 are made of ITO.

The static electricity discharge structure 4 may have a shape of a sharp corner, and of course, the shape of the static electricity discharge structure 4 is not limited thereto, as long as the end of the static electricity discharge structure 4 distal to the signal connection line 1 is thinner than the first end of the signal connection line 1.

In at least one embodiment, the end of the static electricity discharge structure 4 distal to the signal connection line 1 is thinner than the second end of the signal connection line 1. In this case, by transferring a pointed end, the importance position is protected from being damaged.

A plurality of third through holes 41 are provided in the static electricity discharge structure 4.

The reason for providing the third through holes 41 is to make a film layer of the pointed end and a film layer of the second end of the signal connection line 1 connected to the pointed end consistent, ensuring that the static electricity at the second through holes 12 in the second end of the signal connection line 1 can be completely led out by the static electricity discharge structure 4.

The driving chip 3 includes a source driving chip 3 and/or a gate driving chip 3. In this case, the signal connection line 1 may connect the source driving chip 3 to the flexible circuit board; or connect the gate driving chip 3 to the flexible circuit board; or connect the gate driving chip 3 to the source driving chip 3 and connect the source driving chip 3 to the flexible circuit board such that the source driving chip 3 supplies high and low level signals to the gate driving chip 3.

The embodiment of the present disclosure provides a display device including the array substrate of the above embodiment. Since the static electricity discharge structure 4 connected to the second end of the signal connection line 1 is additionally provided on the array substrate in the first embodiment, the charges generated in the manufacturing process of the array substrate can be transferred to the static electricity discharge structure 4, thereby avoiding the problem that ESD occurs at the second end of the signal connection line 1 to burn out the signal connection line 1 to cause a defect in the display device.

The display device may be any product or component having a display function, such as a mobile phone, a tablet computer, a television, a display, a notebook computer, a digital photo frame, a navigator, or the like.

Needless to say, the display device of the embodiment may further include other conventional structures such as a power supply, a display driver, and the like.

It should be understood that, the above embodiments are only exemplary embodiments for the purpose of explaining the principle of the present disclosure, but the present disclosure is not limited thereto. For one of ordinary skill in the art, various variations and improvements may be made without departing from the spirit and essence of the present disclosure, and these variations and improvements should also be considered as falling into the protection scope of the present disclosure.

What is claimed is:

1. An array substrate, comprising a first structure, a second structure, a signal connection line and a static electricity discharge structure,
    wherein the signal connection line comprises a first end connected to the first structure and a second end connected to the second structure, and the static electricity discharge structure is connected to the second end of the signal connection line but not connected to the second structure, and is configured to lead out static electricity,
    the first end has a first through hole, and the second end has a second through hole, the first end is connected, through a first pad, to the first structure at the first through hole, and the second end is connected, through a second pad, to the second structure at the second through hole,
    an end of the static electricity discharge structure distal to the signal connection line is thinner than the first end of the signal connection line, and an end of the static electricity discharge structure distal to the signal connection line is thinner than the second end of the signal connection line.

2. The array substrate of claim 1, wherein the static electricity discharge structure and the signal connection line are formed as an integral structure.

3. The array substrate of claim 1, wherein the second end is thinner than the first end.

4. The array substrate of claim 1, wherein the static electricity discharge structure is provided with a plurality of third through holes.

5. The array substrate of claim 1, wherein the static electricity discharge structure and the signal connection line are made of indium tin oxide.

6. The array substrate of claim 1, wherein the first structure is a peripheral circuit board, and the second structure is a driving chip.

7. The array substrate of claim 6, wherein the peripheral circuit board is a flexible circuit board.

8. The array substrate of claim 6, wherein the driving chip is one of a source driving chip and a gate driving chip.

9. The array substrate of claim 1, wherein the static electricity discharge structure has a shape of a sharp corner.

10. A display device, comprising the array substrate of claim 1.

* * * * *